United States Patent
Chan et al.

(10) Patent No.: US 10,530,358 B2
(45) Date of Patent: Jan. 7, 2020

(54) SWITCHING CIRCUIT CAPABLE OF REDUCING PARASITIC CAPACITANCE VARIATION

(71) Applicant: Realtek Semiconductor Corp., Hsinchu (TW)

(72) Inventors: Cheng-Pang Chan, Hsinchu County (TW); Liang-Huan Lei, Kaosiung (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/002,502

(22) Filed: Jun. 7, 2018

(65) Prior Publication Data
US 2019/0058467 A1 Feb. 21, 2019

(30) Foreign Application Priority Data
Aug. 18, 2017 (TW) .............................. 106128180 A

(51) Int. Cl.
*H03K 17/16* (2006.01)
*H03K 17/14* (2006.01)

(52) U.S. Cl.
CPC ........... *H03K 17/16* (2013.01); *H03K 17/145* (2013.01); *H03K 17/164* (2013.01)

(58) Field of Classification Search
CPC .... H03K 17/16; H03K 17/164; H03K 17/145; H03K 17/161; H03K 17/162; H03K 17/163
See application file for complete search history.

(56) References Cited

U.S. PATENT DOCUMENTS

| 4,924,438 A | 5/1990 | Kobatake |
| 9,584,097 B2* | 2/2017 | Bakalski ................ H03H 11/28 |
| 2011/0090024 A1 | 4/2011 | Chen et al. |
| 2014/0068391 A1* | 3/2014 | Goel ................... H03M 13/152 |
| | | 714/785 |
| 2017/0126017 A1* | 5/2017 | Chen .................... H03K 17/693 |

FOREIGN PATENT DOCUMENTS

TW 201630249 A 8/2016

OTHER PUBLICATIONS

Concise Summary of Office Action Taiwanese Application No. 106128180, dated Apr. 24, 2018.
Notice of Allowance of Office Action Taiwanese Application No. 106128180, dated May 28, 2018.

* cited by examiner

*Primary Examiner* — Patrick C Chen
(74) *Attorney, Agent, or Firm* — Birch, Stewart, Kolasch & Birch, LLP

(57) ABSTRACT

A switching circuit includes: a main switch array including multiple main switch elements respectively arranged on multiple main signal paths configured in a parallel connection, wherein the multiple main signal paths are coupled with a first circuit node; a main switch control circuit for controlling the multiple main switch elements; an auxiliary switch array including multiple auxiliary switch elements respectively arranged on multiple auxiliary signal paths configured in a parallel connection, wherein the multiple auxiliary signal paths are also coupled with the first circuit node; and an auxiliary switch control circuit for controlling the multiple auxiliary switch elements so as to maintain a total number of turned-on switch elements in the main switch array and the auxiliary switch array to be equal to or more than a threshold quantity.

7 Claims, 2 Drawing Sheets

SWITCHING CIRCUIT CAPABLE OF REDUCING PARASITIC CAPACITANCE VARIATION

CROSS-REFERENCE TO RELATED APPLICATIONS

This application claims the benefit of priority to Patent Application No. 106128180, filed in Taiwan on Aug. 18, 2017 the entirety of which is incorporated herein by reference for all purposes.

BACKGROUND

The disclosure generally relates to a switching circuit and, more particularly, to a switching circuit capable of reducing parasitic capacitance variation.

Switches configured in parallel connection are often employed in many integrated circuits, so that the circuitry characteristics of the integrated circuit can be adjusted by turning on or turning off a certain number of switches.

The aforementioned turning on or turning off operations of the switches cause great variation in the parasitic capacitance within the integrated circuit. The circuitry characteristics of some integrated circuits are very sensitive to the magnitude of the parasitic capacitance. Accordingly, the operating performance or accuracy of the integrated circuit would be adversely affected if the variation of the parasitic capacitance cannot be effectively reduced.

SUMMARY

In view of the foregoing, it may be appreciated that a substantial need exists for methods and apparatuses that mitigate or reduce the problems above.

An example embodiment of a switching circuit is disclosed, comprising: a main switch array comprising multiple main switch elements respectively arranged on multiple main signal paths configured in a parallel connection, wherein the multiple main signal paths are coupled with a first circuit node; a main switch control circuit arranged to operably control switching operations of the multiple main switch elements; an auxiliary switch array comprising multiple auxiliary switch elements respectively arranged on multiple auxiliary signal paths configured in a parallel connection, wherein the multiple auxiliary signal paths are coupled with the first circuit node; an auxiliary switch control circuit, coupled with the main switch control circuit, arranged to operably control switching operations of the multiple auxiliary switch elements, so as to maintain a total number of turned-on switch elements in the main switch array and the auxiliary switch array to be equal to or more than a threshold quantity.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

Figure 1:
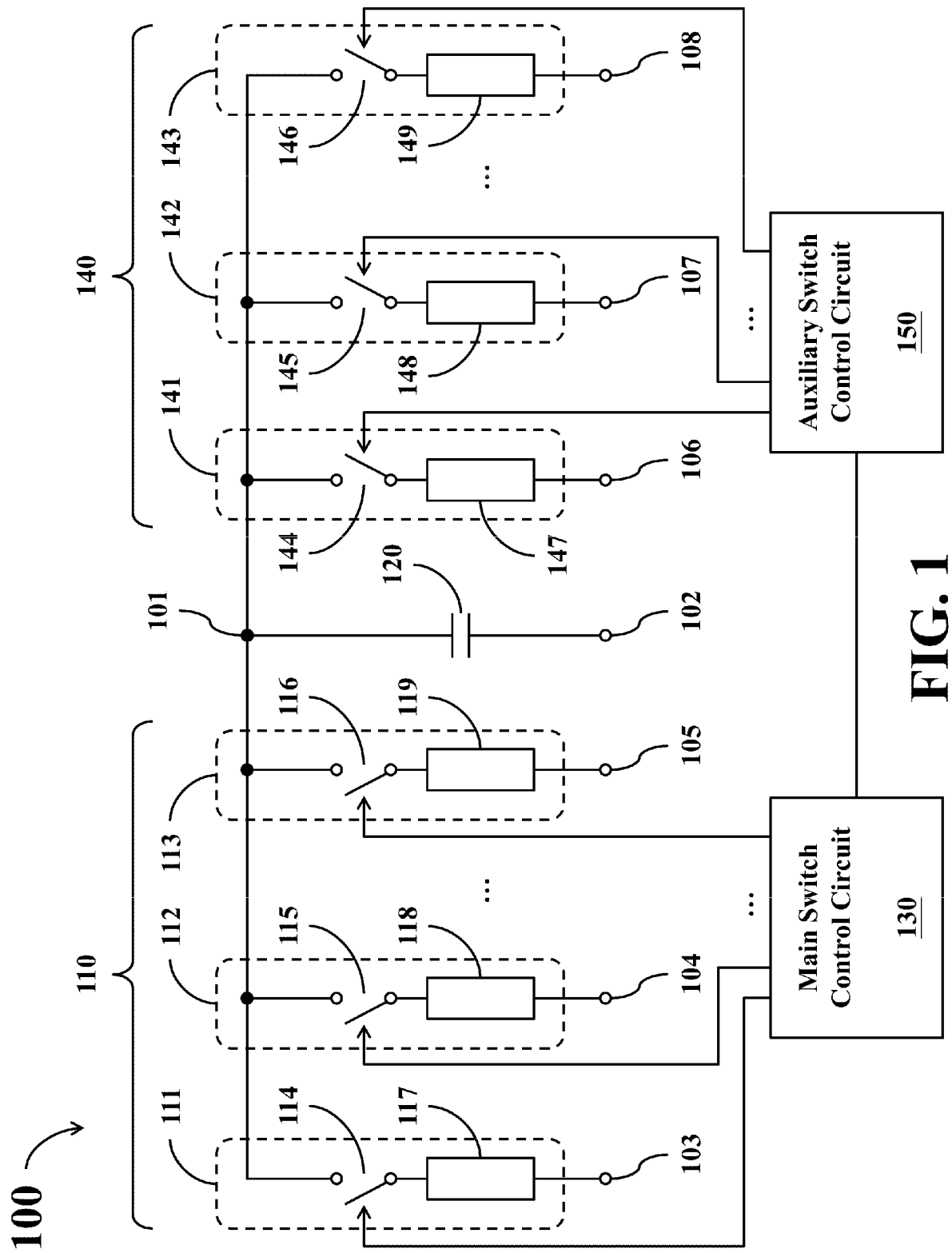
FIG. 1 shows a simplified functional block diagram of a switching circuit according to one embodiment of the present disclosure.

FIG. 1 shows a simplified functional block diagram of a switching circuit 100 according to one embodiment of the present disclosure. The switching circuit 100 comprises a main switch array 110, a main switch control circuit 130, an auxiliary switch array 140, and an auxiliary switch control circuit 150.

The main switch array 110 comprises multiple main signal paths (e.g., the exemplary main signal paths 111, 112, and 113 shown in FIG. 1) configured in a parallel connection, and also comprises multiple main switch elements (e.g., the exemplary main switch elements 114, 115, and 116 shown in FIG. 1) respectively arranged on the multiple main signal paths. The main switch control circuit 130 is arranged to operably control the switching operations of the multiple main switch elements in the main switch array 110. The auxiliary switch array 140 comprises multiple auxiliary signal paths (e.g., the exemplary auxiliary signal paths 141, 142, and 143 shown in FIG. 1) configured in a parallel connection, and also comprises multiple auxiliary switch elements (e.g., the exemplary auxiliary switch elements 144, 145, and 146 shown in FIG. 1) respectively arranged on the multiple auxiliary signal paths. The auxiliary switch control circuit 150 is coupled with the main switch control circuit 130, and arranged to operably control the switching operations of the multiple auxiliary switch elements in the auxiliary switch array 140, so as to maintain a total number of turned-on switch elements in the main switch array 110 and the auxiliary switch array 140 to be equal to or more than a threshold quantity, wherein the threshold quantity is greater than zero.

As shown in FIG. 1, the main signal path 111 of the main switch array 110 is coupled between the circuit nodes 101 and 103. The main signal path 112 is coupled between the circuit nodes 101 and 104. The main signal path 113 is coupled between the circuit nodes 101 and 105. The auxiliary signal path 141 of the auxiliary switch array 140 is coupled between the circuit nodes 101 and 106. The auxiliary signal path 142 is coupled between the circuit nodes 101 and 107. The auxiliary signal path 143 is coupled between the circuit nodes 101 and 108.

In the embodiment of FIG. 1, the circuit nodes 102, 103, 104, 105, 106, 107, and 108 may be different circuit nodes. In practice, the aforementioned circuit node 102 may be a fixed-voltage terminal (e.g., a ground terminal).

In the practical circuitry environment, a parasitic capacitor 120 often exists between the circuit nodes 101 and 102. In other words, the aforementioned parasitic capacitor 120, all of the main signal paths in the main switch array 110, and all of the auxiliary signal paths in the auxiliary switch array 140 are configured in parallel connection.

Additionally, on each specific main signal path in the main switch array 110, an appropriate circuit module configured in a serial connection with the main switch element on the specific main signal path may be arranged thereon as needed. On the other hand, on each specific auxiliary signal path in the auxiliary switch array 140, an appropriate circuit module configured in a serial connection with the auxiliary switch element on the specific auxiliary signal path may be arranged thereon as needed.

In the embodiment of FIG. 1, for example, a main circuit module 117 configured in a serial connection with the main switch element 114 is arranged on the main signal path 111. A main circuit module 118 configured in a serial connection with the main switch element 115 is arranged on the main signal path 112. A main circuit module 119 configured in a serial connection with the main switch element 116 is arranged on the main signal path 113. An auxiliary circuit module 147 configured in a serial connection with the auxiliary switch element 144 is arranged on the auxiliary signal path 141. An auxiliary circuit module 148 configured in a serial connection with the auxiliary switch element 145 is arranged on the auxiliary signal path 142. An auxiliary circuit module 149 configured in a serial connection with the auxiliary switch element 146 is arranged on the auxiliary signal path 143.

In practice, each of the aforementioned main switch elements or auxiliary switch elements may be realized with an appropriate transistor. Each of the main circuit modules or auxiliary circuit modules may be realized with a single circuit component or a combination of multiple circuit components. For example, each main circuit module may be realized with a single analog component (e.g., a resistor, a capacitor, a conductor, etc.), may be realized with a single digital circuit component (e.g., a logic gate, a transistor, a flip-flop, etc.), may be realized with a combination of multiple digital circuit components, or may be realized with a combination of analog circuit components and digital circuit components.

Additionally, each of the main switch control circuit 130 and the auxiliary switch control circuit 150 may be realized with an appropriate circuit. For example, each of the main switch control circuit 130 and the auxiliary switch control circuit 150 may be realized with a micro-processor or a micro-controller. In some embodiments, the auxiliary switch control circuit 150 may be realized with a combination of multiple logic gates or a combination of multiple signal converting circuits.

All of the functional blocks of the switching circuit 100 may be integrated into a single integrated circuit.

In operations, the circuitry characteristics (e.g., equivalent resistance, equivalent capacitance, equivalent conductance, gain, operating bandwidth, frequency response, or the like) of the integrated circuit in which the switching circuit 100 resides may be adjusted by changing the total number of turned-on main switch elements in the main switch array 110. Accordingly, the main switch control circuit 130 may program the control signals of the main switch elements in the main switch array 110 to adjust the circuitry characteristics of the integrated circuit in which the switching circuit 100 resides.

On the other hand, the auxiliary switch control circuit 150 may program the control signals of the multiple auxiliary switch elements to modify the total number of turned-on auxiliary switch elements in the auxiliary switch array 140, so that the total number of turned-on switch elements in the main switch array 110 and the auxiliary switch array 140 can be maintained to be equal to or greater than a threshold quantity. In practice, the auxiliary switch control circuit 150 may obtain the quantity of main switch elements to be turned on according to the control signals of the main switch elements generated by the main switch control circuit 130. Alternatively, the main switch control circuit 130 may transmit the quantity of main switch elements to be turned on to the auxiliary switch control circuit 150 through a signal having appropriate format, so that the auxiliary switch control circuit 150 can obtain the quantity of main switch elements to be turned on.

Please note that the total number of the auxiliary switch elements (i.e., the total number of the auxiliary signal paths) in the auxiliary switch array 140 may be the same as or different from the total number of the main switch elements (i.e., the total number of the main signal paths) in the main switch array 110.

In the embodiments where the total number of the auxiliary switch elements in the auxiliary switch array 140 is equal to the total number of the main switch elements in the main switch array 110, the auxiliary switch control circuit 150 may configure the aforementioned threshold quantity to be equal to the total number of the main switch elements in the main switch array 110. For example, supposing that there are N main switch elements in the main switch array 110 while there are N auxiliary switch elements in the auxiliary switch array 140. In this case, the auxiliary switch control circuit 150 may be realized with N inverters configured in parallel connection for respectively inverting the control signals of the N main switch elements in the main switch array 110 to generate the control signals of the N auxiliary switch elements in the auxiliary switch array 140. As a result, the total number of turned-on switch elements in the main switch array 110 and the auxiliary switch array 140 can be maintained to be N.

In the embodiments where the total number of the auxiliary switch elements in the auxiliary switch array 140 is less than the total number of the main switch elements in the main switch array 110, the auxiliary switch control circuit 150 may configure the aforementioned threshold quantity to be less than the total number of the main switch elements in the main switch array 110. For example, depending upon the environment of practical circuit application, the auxiliary switch control circuit 150 may configure the aforementioned threshold quantity to be greater than or equal to one tenth of the total number of the main switch elements in the main switch array 110, one third of the total number of the main switch elements in the main switch array 110, half of the total number of the main switch elements in the main switch array 110, two third of the total number of the main switch elements in the main switch array 110, or 80% of the total number of the main switch elements in the main switch array 110.

When the main switch control circuit 130 turns on all of the main switch elements in the main switch array 110, the auxiliary switch control circuit 150 may turn off all of the auxiliary switch elements in the auxiliary switch array 140, so as to maintain the total number of turned-on switch elements in the switching circuit 100 to be less than or equal to a predetermined quantity (i.e., the total number of the main switch elements in the main switch array 110 in this case). On the contrary, when the main switch control circuit 130 turns off all of the main switch elements in the main switch array 110, the auxiliary switch control circuit 150 may turn on a part of or all of the auxiliary switch elements in the auxiliary switch array 140, so as to maintain the total number of turned-on switch elements in the switching circuit 100 to be greater than or equal to the aforementioned threshold quantity.

As a result, the variation degree of the turned-on switch elements in the switching circuit 100 can be effectively controlled under a predetermined range due to the cooperation of the auxiliary switch array 140 and the auxiliary switch control circuit 150.

The switching of the main switch elements conducted by the main switch control circuit 130 would change the capacitance of the parasitic capacitor 120, but the switching of the auxiliary switch elements conducted by the auxiliary switch control circuit 150 renders the total number of turned-on switch elements in the main switch array 110 and the auxiliary switch array 140 to be maintained within a more stable range. This mechanism effectively reduces the variation degree of the total number of turned-on switch elements in the switching circuit 100, thereby reducing the impact to the capacitance of the parasitic capacitor 120 caused by the switching operations of the main switch array 110.

On the other hand, since the structure of the switching circuit 100 reduces the variation of the capacitance of related parasitic capacitor 120, the operating performance or accuracy of the integrated circuit in which the switching circuit 100 resides can be effectively improved.

Please note that the circuit structure illustrated in FIG. 1 is merely an exemplary embodiment rather than a restriction to practical implementation.

Figure 2:
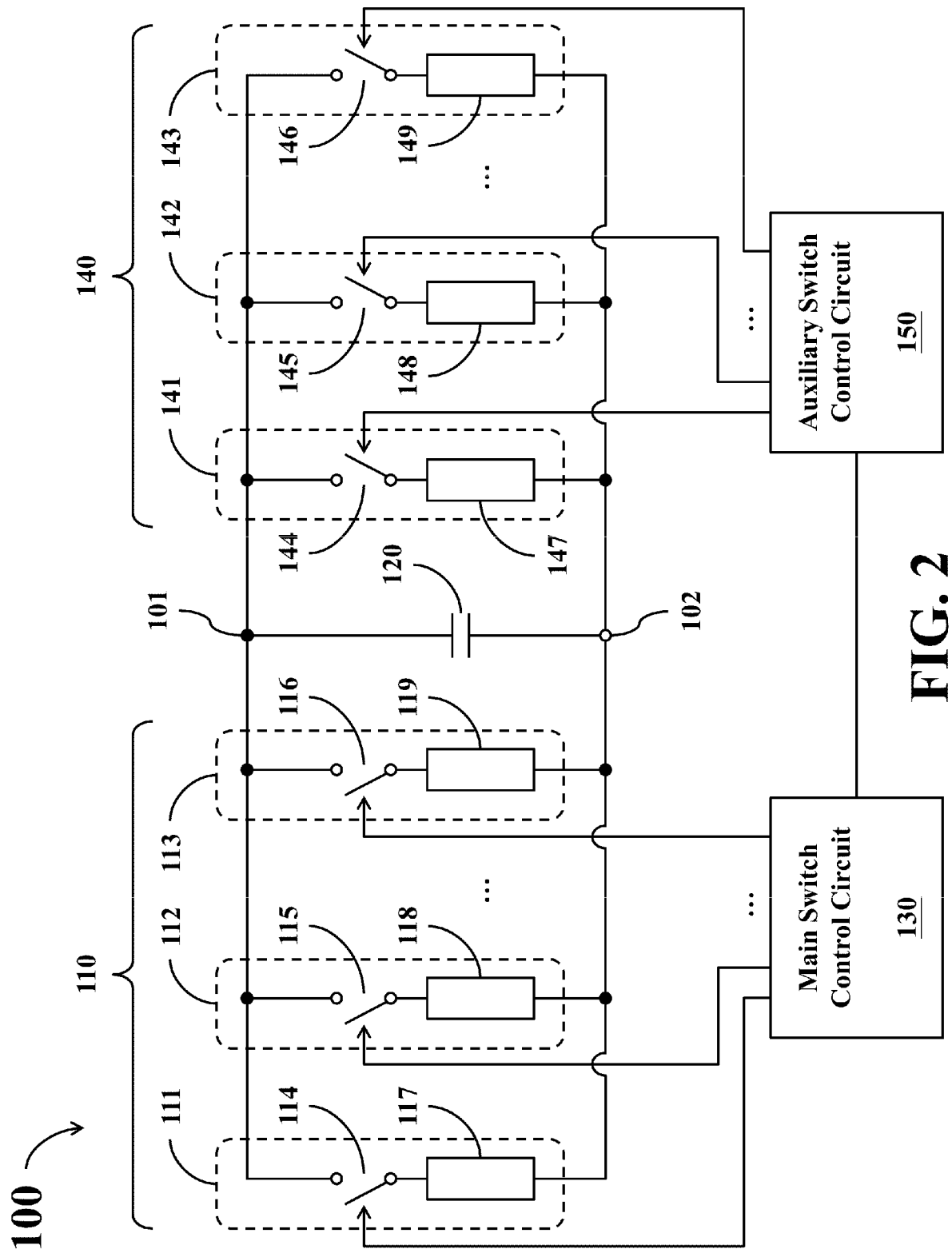
FIG. 2 shows a simplified functional block diagram of a switching circuit according to another embodiment of the present disclosure.

For example, FIG. 2 shows a simplified functional block diagram of the switching circuit 100 according to another embodiment of the present disclosure. In the embodiment of FIG. 2, each of the multiple main signal paths 111, 112, and 113 in the main switch array 110 is coupled between the circuit nodes 101 and 102, while each of the multiple auxiliary signal paths 141, 142, and 143 in the auxiliary switch array 140 is coupled between the circuit nodes 101 and 102. In this embodiment, the parasitic capacitor 120, all of the main signal paths in the main switch array 110, and all of the auxiliary signal paths in the auxiliary switch array 140 are also configured in parallel connection.

In practice, as long as the parallel connection relationship among the parasitic capacitor 120, the main switch array 110, and the auxiliary switch array 140 remained unchanged, the coupling relationship of respective main signal paths or respective auxiliary signal paths may be modified based on the requirement of practical implementation.

Additionally, in some embodiment, a part of or all of the auxiliary circuit modules in the auxiliary switch array 140 may be omitted to further simplify the circuitry complexity.

The foregoing descriptions regarding the implementations, connections, operations, and related advantages of other corresponding components in the embodiment of FIG. 1 are also applicable to the embodiment of FIG. 2. For the sake of brevity, those descriptions will not be repeated here.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A switching circuit (100) for reducing variation of capacitance of a parasitic capacitor (120), comprising:
   a main switch array (110) comprising multiple main switch elements (114, 115, 116) respectively arranged on multiple main signal paths (111, 112, 113) configured in a parallel connection, wherein the multiple main signal paths (111, 112, 113) are coupled with a first circuit node (101);
   a main switch control circuit (130) arranged to operably control switching operations of the multiple main switch elements (114, 115, 116);
   an auxiliary switch array (140) comprising multiple auxiliary switch elements (144, 145, 146) respectively arranged on multiple auxiliary signal paths (141, 142, 143) configured in a parallel connection, wherein the multiple auxiliary signal paths (141, 142, 143) are coupled with the first circuit node (101);
   an auxiliary switch control circuit (150), coupled with the main switch control circuit (130), arranged to operably control switching operations of the multiple auxiliary switch elements (144, 145, 146), so as to maintain a total number of turned-on switch elements in the main switch array (110) and the auxiliary switch array (140) to be equal to or more than a threshold quantity;
   wherein the multiple main signal paths (111, 112, 113), the multiple auxiliary signal paths (141, 142, 143), and the parasitic capacitor (120) are configured in parallel connection, while a total number of the auxiliary switch elements in the auxiliary switch array (140) is less than the total number of the main switch elements in the main switch array (110).

2. The switching circuit (100) of claim 1, wherein the threshold quantity is equal to or greater than one tenth of a total number of the main switch elements (114, 115, 116) in the main switch array (110).

3. The switching circuit (100) of claim 1, wherein the threshold quantity is equal to or greater than one third of the total number of the main switch elements (114, 115, 116) in the main switch array (110).

4. The switching circuit (100) of claim 1, wherein the threshold quantity is equal to or greater than half of the total number of the main switch elements (114, 115, 116) in the main switch array (110).

5. The switching circuit (100) of claim 1, wherein the threshold quantity is equal to or greater than two third of the total number of the main switch elements (114, 115, 116) in the main switch array (110).

6. The switching circuit (100) of claim 1, wherein the threshold quantity is equal to or greater than 80% of the total number of the main switch elements (114, 115, 116) in the main switch array (110).

7. The switching circuit (100) of claim 1, wherein the threshold quantity is equal to the total number of the main switch elements (114, 115, 116) in the main switch array (110).

* * * * *